United States Patent [19]

Bates et al.

[11] 3,974,457

[45] Aug. 10, 1976

[54] TIME AND FREQUENCY CONTROL UNIT

[75] Inventors: Alvin G. Bates, Clarksville; Terrence L. McGovern, Laurel, both of Md.

[73] Assignee: The United States of America as represented by the Secretary of the Navy, Washington, D.C.

[22] Filed: Sept. 19, 1975

[21] Appl. No.: 615,023

[52] U.S. Cl. .................................. 331/1 A; 325/63; 325/390; 325/418; 328/48; 328/155; 331/39; 331/41; 331/43; 331/175
[51] Int. Cl.² ........................................ H03B 3/04
[58] Field of Search ............... 331/1 R, 1 A, 37–43, 331/117 R, 175; 328/155, 41, 42, 48; 325/30, 416, 418, 420, 63, 17

[56] References Cited
UNITED STATES PATENTS

| | | | |
|---|---|---|---|
| 3,560,880 | 2/1971 | Easton et al. | 331/175 X |
| 3,662,269 | 5/1972 | Osborne et al. | 325/63 |

Primary Examiner—Siegfried H. Grimm

[57] ABSTRACT

The present invention relates to a time and frequency control unit which is capable of compensating for long-term crystal oscillator drift and other errors in a reference oscillator signal by both coarse and fine (vernier) controlling. The invention takes the reference oscillator frequency, $f_o$, divides it by a controlled factor $a$ and mixes $f_o$ with $f_o/a$ to produce an $f_o + f_o/a$ signal. The $f_o + f_o/a$ signal is then divided by a second controlled factor $b$ and mixed again with $f_o$ to yield a signal of frequency $f_o \pm (f_o + f_o/a) \, 1/b$, where $f_f$, the final output frequency, is determined after a filter stage sets the operation sign of the above expression (to plus or minus). Where $f_f$ is intended to be constant with a changing $f_o$, the values of $a$ and $b$ are changed. From the above expression, it is apparent that a change in $a$ makes a fine correction whereas a change in $b$ translates the frequency with a coarse adjustment.

10 Claims, 6 Drawing Figures

TIME AND FREQUENCY CONTROL UNIT

SUMMARY OF THE INVENTION

The present invention provides apparatus which can be used on-board a satellite to correct long-term crystal oscillator frequency drift. Typical high quality crystal oscillators drift, the drift being on the order of 1 part per $10^{-10}$ per day or less. The present invention corrects for this drift by establishing a drift rate based on the drift history. The invention also functions as a frequency translator to offset the frequency of oscillation of the source signal by a predetermined amount. The invention also removes any frequency bias in source signal. In the current application of this invention the offset amount is settable in the band of − 84.48 parts per million (PPM) to − 145.51 PPM when the source signal has a 5.0 MHz ± 5 Hz oscillation frequency.

The subject time and frequency control unit employs two counter/holding-register pairs which function as coarse and vernier frequency controls. Since the probability of crystal drift is known, pulses are clocked into the vernier counter at a specified rate and when an end point is reached the coarse counter will be incremented. The increments of the coarse control are approximately equal to 0.04 Hz with each increment having about 7000 divisions in the vernier control. The vernier end points are called roll-over numbers and the coarse control will be counted up or down depending on which end point the vernier control has traversed. Roll-over gates are supplied to automatically insert new roll-over numbers into the vernier control and also to gate the proper update pulse to the coarse control. By utilizing roll-over numbers and roll-over gates the invention provides a continuity of time and frequency control over the entire life of the satellite.

The time and frequency control unit may be controlled from the ground or from an on-board computer. A slope correction rate generator is provided by the invention to automatically update the coarse/vernier control for slope rate correction once a drift rate has been established. The rate generator provides increments for drift rate correction in a manner similar to that of the on-board computer.

DESCRIPTION OF THE PREFERRED EMBODIMENT

Figure 1:
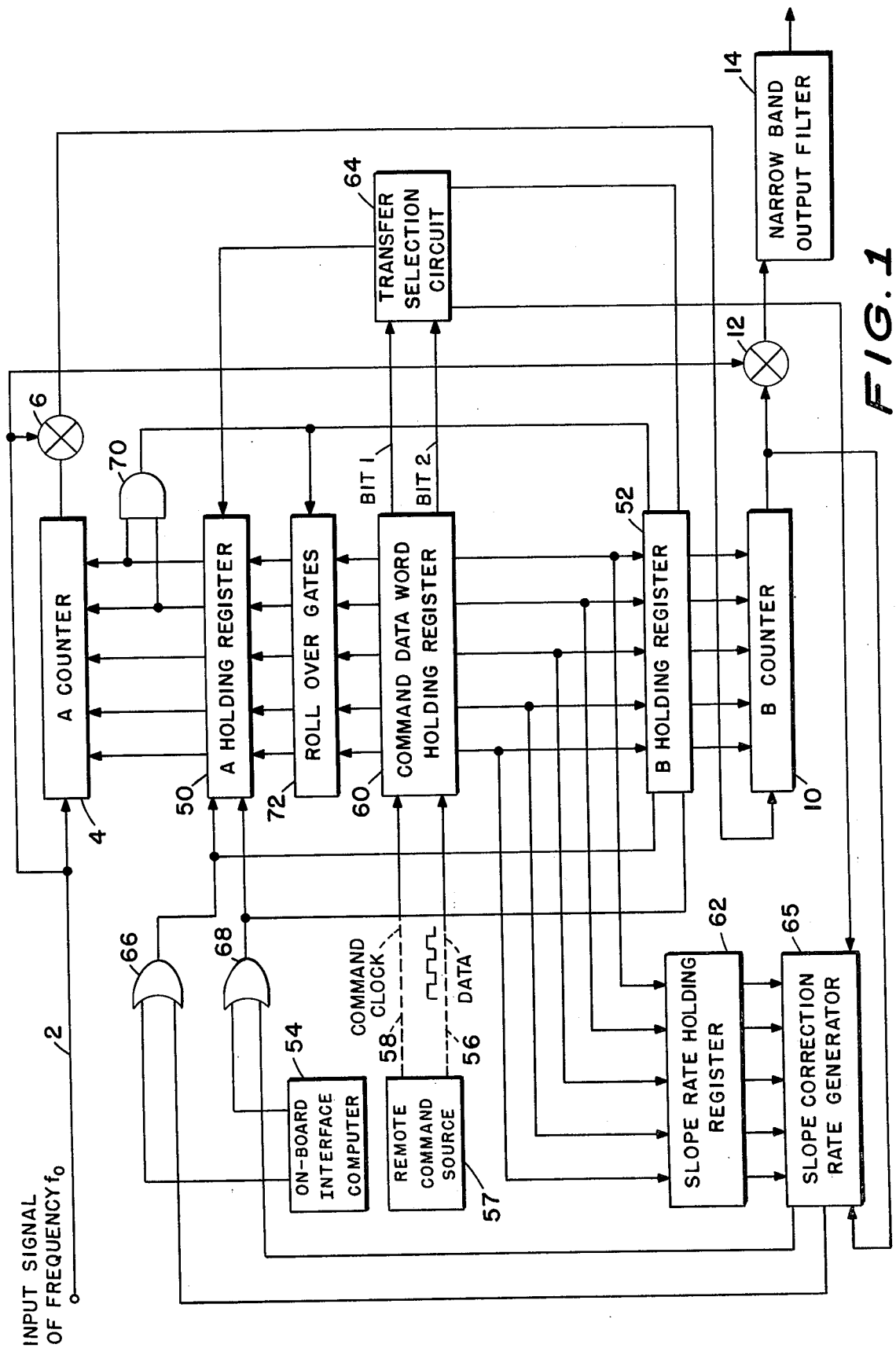
FIG. 1 is a block diagram of the time and frequency control unit incorporating the principles of the invention.

Referring to FIG. 1, an input 2 is shown carrying a signal of frequency $f_o$. In the preferred embodiment $f_o$ should be 5 MHz. The signal splits, with one path of it entering a conventional A counter 4 which divides the frequency $f_o$ by a modulus number $a$. The output from the A counter 4 meets the other path of the $f_o$ signal at a first mixer 6. The mixer 6 produces a signal of frequency $$\frac{f_o}{a} + f_o.$$

The frequency of this output is referred to as $f_1$. The $f_1$ signal enters a convention B counter 10 where it is divided by a second modulus number $b$ before it is mixed in a second mixer 12 with the original $f_o$ signal. The output of the second mixer 12 is equal to $$f_o \pm \frac{f_1}{b}.$$

In expanded form this mixed output is equivalent to $$f_o \pm \frac{\left[\frac{f_o}{a} + f_o\right]}{b}.$$

Figure 2:
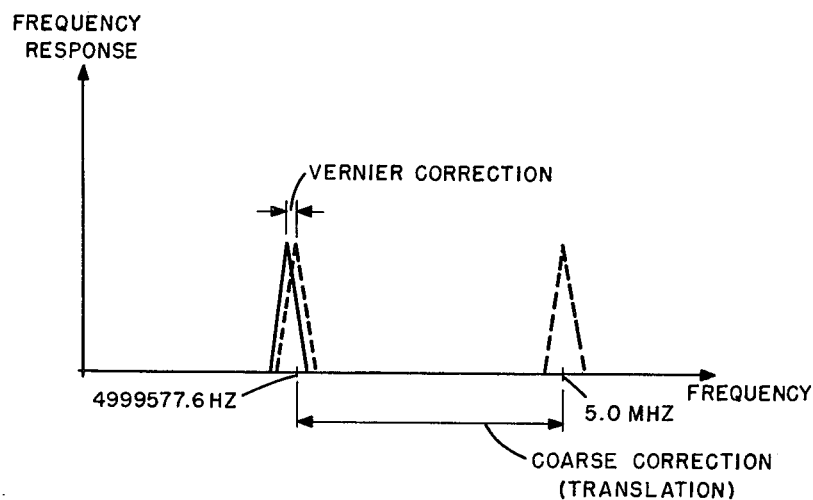
FIG. 2 is a graph illustrating the comparative effects on frequency produced by the coarse control and vernier control.

It is apparent from this expression that a change in $a$ is of much less significance than a change in $b$. The A counter 4 which divides by $a$ is a vernier (or fine) control element; the B counter 10 is a coarse, translational control element. The distinction between the two control means is shown in FIG. 2. Referring again to FIG. 1, the mixed output from the second mixer 12 is passed through a narrow band output filter 14. The output from output filter 14 is the output of the time and frequency control unit. The system is designed to have a very carefully balanced analog single sideband mixer with the capability of suppressing undesired sidebands well over 40 db before filtering.

Figure 3:
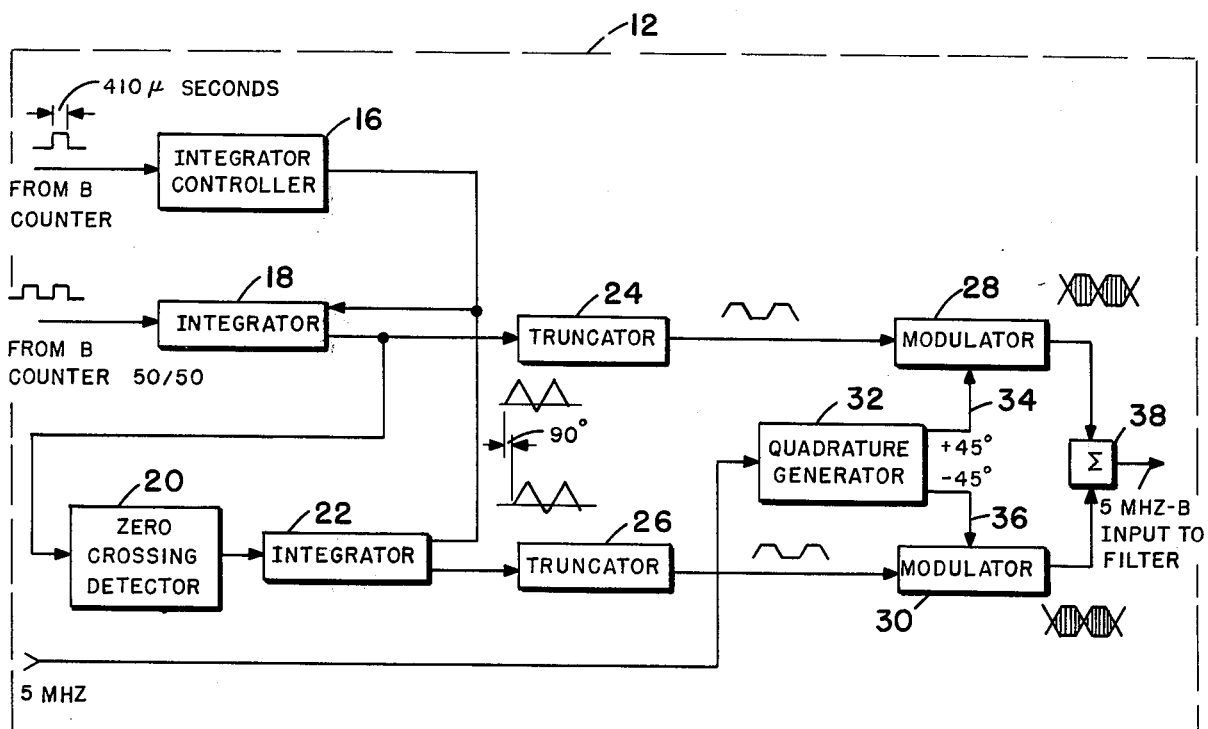
FIG. 3 is a block diagram of an analog single sideband generator used as a mixer in the present invention.

FIG. 3 is a block diagram of the second mixer 12 which is characterized in the preferred embodiment as a single sideband generator. FIG. 3 shows two outputs from B counter 10 going to an integrator controller 16 and a first integrator 18 respectively. The output from first integrator 18 is in the form of a triangular wave, i.e., the integration of the pulse coming from the B counter 10. The output from the first integrator 18 enters a zero crossing detector 20 which pulses whenever the leading edge of the integrated output from the first integrator 18 crosses the zero amplitude level. The pulse from the zero crossing detector 20 is integrated by a second integrator 22 which puts out a triangular wave similar to that of the first integrator 18 except that the output from the second integrator 22 is 90° out of phase with the output from the first integrator 18. The outputs from the first integrator 18 and the second integrator 22 are truncated by truncator 24 and truncator 26, respectively, and then enter modulator 28 and modulator 30, respectively. The 5 MHz ($f_o$) signal is shown entering a quadrature generator 32 which produces two signals which are out-of-phase by 90°; one lead-signal 34 is shifted to lead in phase by 45°, the other a lag signal 36 to lag in phase 45°. Lead signal 34 enters modulator 28 together with the output from truncator 24. Lag signal 36 enters modulator 30, together with the output from truncator 26, to yield a modulated signal similar to, but of different phase from, the signal from modulator 28. The modulated signals from modulator 28 and modulator 30 are summed in summer 38 to produce the single sideband (SSB) output which is then fed into the narrow band filter 14 as shown in FIG. 1. The SSB output mixer 12 is independent of frequency and amplitude. The raw output has no more than −35 dB unwanted sidebands harmonically related to the audio frequencies; the 5 MHz ($f_o$) carrier is down by 50 dB.

Figure 4:
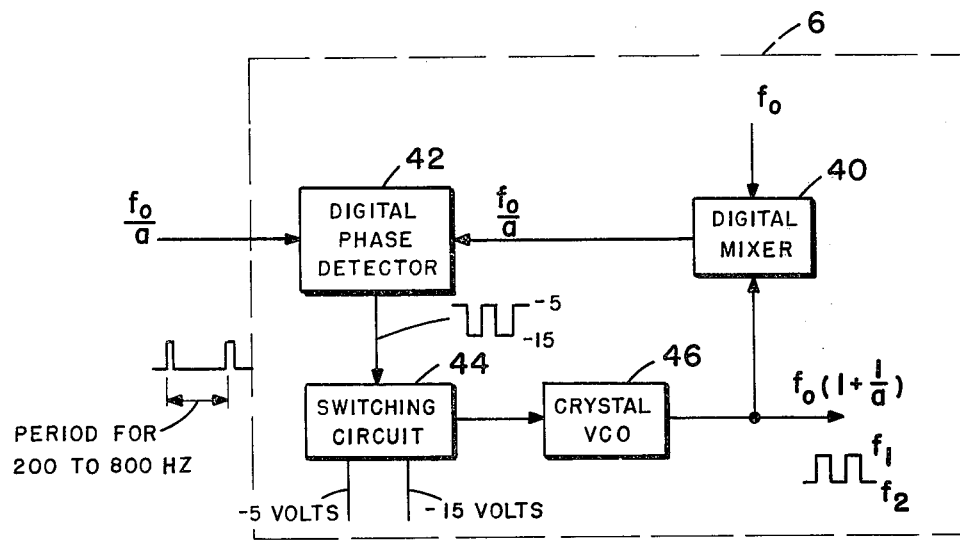
FIG. 4 is a block diagram of a digital voltage controlled oscillator (VCO), used as a mixer in the present invention.

In the present embodiment, a digital phase-lock loop is used as the first mixer 6. As seen in FIG. 4, the frequency $f_o$ enters a digital mixer 40 which transmits an output of frequency $f_o/a$ into a digital phase detector 42. The digital phase detector 42 pulses a switching circuit 44 which inputs to a crystal voltage controlled oscillator (VCO) 46. The output from the crystal VCO 46 is in the form of pulses carrying a signal indicating a frequency of $$f_o (1 + \frac{1}{a}).$$

The "loop" of the phase-lock loop is completed by returning the output from the crystal VCO 46 back into the digital mixer 40 which mixes incoming $f_o$ with $$f_o + \frac{f_o}{a}$$

to produce $$(f_o + \frac{f_o}{a}) - f_o$$

or $f_o/a$ which is fed into digital phase detector 42 and so on.

Although the present embodiment includes a digital mixer stage for first mixer 6 it is to be noted that the analog single sideband generator stage of second mixer 12 could be used as the first mixer 6 as well as the second mixer 12. The analog mixer is considerably more sensitive than the digital VCO mixer stage described; thus, although the analog mixer could be substituted for the digital VCO mixer, the converse is not true.

Figure 5:
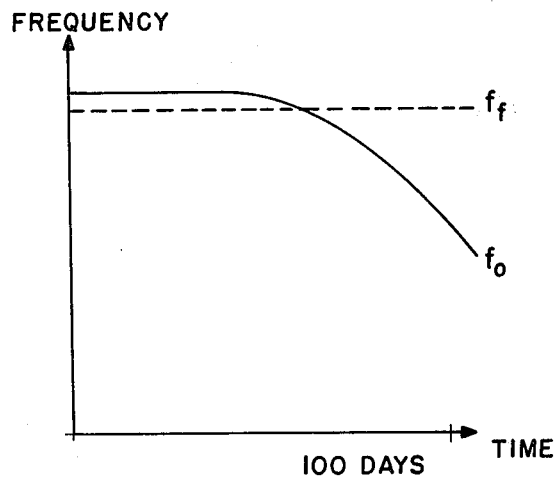
FIG. 5 is a graph showing frequency vs time, particularly showing the drift of input frequency $f_o$, and the stabilized value of output frequency, $f_f$.

FIG. 5 shows the gradual drift of $f_o$ over a time period such as 100 days. By altering the value of $a$ and/or $b$ it can been seen from the foregoing that final output frequency $f_f$, can be held constant. Referring again to FIG. 1, in order to alter the values of $a$ and $b$ in the A counter 4 and B counter 10, respectively, an A holding register 50 which holds the value of $a$ for A counter 4 and a B holding register 52 for holding the value of $b$ to be used by B counter 10 are provided.

The values held in the A register 50 and B register 52 are controlled by two alternative sources. Which source is selected at any given time is determined by remote command source 57 which switches between sources as required. The first is an on-board computer 54 which clocks on clock line 70 at about 400 kHz and informs the A register 50 and B register 52 to increment or decrement on up/down line 72. The on-board computer 54 can control frequency to a resolution of <3.5 parts in $10^{-12}$ for each computer clock to compensate for a change in $f_o$. The other alternative controller source is the slope correction rate generator 64 with granularity of 38 sec. minimum. Upon receipt of transmitted time markings from the satellite via conventional telemetry means, remote command source 57 communicates with a command data word holding register 60 via a command data line 56 and a command clock line 58 which operate in a conventional communication fashion. The data word communicated into the command data word holding register 60 includes data to be transferred into the A register 50, the B register 52, or a drift rate holding register 62. The first two bits of the data word indicate which register is to receive data from the command data word holding register 60. A transfer selection circuit 64 actually implements this decision by turning on the appropriate register to receive data when the proper two bit code is sensed on bit 1 line and bit 2 line.

The slope rate holding register 62 is an updated register which represents the drift slope of frequency over time as shown in FIG. 5. Again referring to FIG. 1, associated with the slope rate holding register 62 is a slope correction rate generator 65 which receives updated data from the slope rate holding register 62 and is turned on by the transfer selection circuit 64 and output from B counter 10. The output from the slope correction rate generator 65 is gated into OR gate 66 with the clock line 70 of the on-board computer 54 and into OR gate 68 with an up/down line 72 from the on-board computer 54. Outputs from OR gate 66 and OR gate 68 go to both the A holding register 50 and B holding register 52 to alter the values of $a$ and $b$ contained therein, respectively.

In order to preserve the continuity of the changing of $a$ and $b$, the following scheme is employed. The value for $a$ in A holding register 50 is fixed between a low-point and high-point determined by a gate-overflow circuit 70. For example, the range for $a$ may be set as 6300 to 13,469. When $a$ in the A holding register 50 is about to traverse 6300 (in a decrementing fashion) or 13,469 (in an incrementing fashion) gate-overflow circuit 70 inputs a signal to the B holding register 52 to change the value of $b$ by one count and rolls $a$ to the other end point. If $b$ were 11,837 and $a$ reached +13,469 (by incrementing), a signal would inform B holding register 52 to increment $b$ by one to 11,838 while a simultaneous signal to roll-over gate 72 would be transmitted to reset the A holding register 50 value of $a$ to 6300; $a$ changes a maximum of about 7000 counts (in the above example) before $b$ is changed by one count. Thus, when $b$ is changed by a count, $a$ is reset to a new value which offsets the large change effected by the change of $b$. The roll-over gating of the A register 50 acts with the changing of the value of $b$ to provide continuity in the frequency control.

Figure 6:
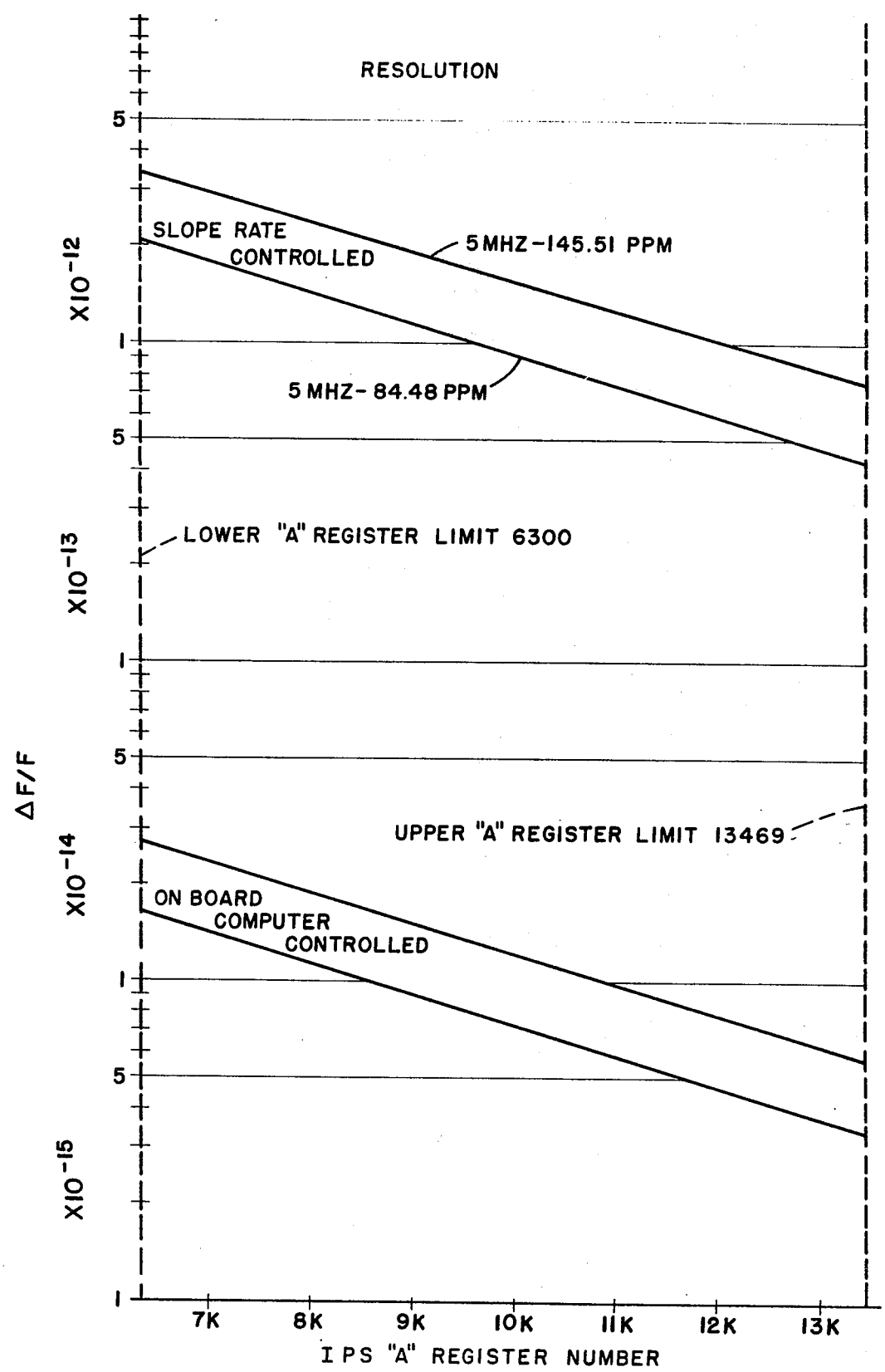
FIG. 6 is a graph of resolution versus register numbers.

FIG. 6 shows the performance of the system in graphical form. The lower band showing the on-board computer control means (represented in FIG. 1 by numeral 54) indicates how an increment of $a$ affects the frequency resolution on the order of $10^{-15}$. The larger granularity of the slope rate controlled network is shown in the upper band. The graph of FIG. 6 is derived from the frequency relationships previously discussed where $F = f_f$ and $\Delta F$ is the offset term $$(\frac{f_o}{a} + f_o) \frac{1}{B}.$$

It is believed apparent that the invention may be practiced other than as specifically detailed herein without departing from the scope of the invention as defined by the following claims.

We claim:

1. A time and frequency control unit comprising:
    an input reference oscillator signal of frequency, $f_o$,
    a first counter, having $f_o$ as an input, for producing an output signal at a frequency $f_o/a$, where $a$ is a first modulus number,
    a first mixer connected to the A counter for mixing the reference oscillator signal with the output from said first counter to produce a signal of frequency $$f_1 = \frac{f_o}{a} + f_o,$$

a second counter connected to the output of said first mixer for producing an output signal at frequency $f_1/b$, where $b$ is a second modulus number,
    a second mixer connected to the output of said second counter for mixing the output from said second counter with said reference oscillator signal to produce a signal of frequency $$f_o \pm \frac{f_1}{b},$$

and
    means connected to the output of said second mixer for setting the operation sign of the second mixer output at plus or minus, the output determined therefrom having a constant frequency $f_f$.

2. A time and frequency control unit as defined in claim 1 further including an error control means comprising:
    a first holding register connected to said first counter for storing the modulus number $a$ by which said first counter divides said reference frequency signal $f_o$,
    a second holding register connected to said second counter for storing the modulus number $b$ by which said second counter divides said signal frequency $f_1$, and
    a means connected to said first and second holding registers for selectively changing the contents of each of said first and second holding registers.

3. A time and frequency control unit as defined in claim 2 wherein said error control means further comprises:
    a first alternative network for error correction comprising an on-board computer interface for selectively incrementing and decrementing said first and second holding registers, and
    a second alternative network comprising:
        a remote command source,
        a command data word holding register, operably connected to said remote command source for storing a command data word transmitted by the remote command source,
        a slope rate holding register connected to the command data word holding register, and
        a slope correction rate generator connected to the slope rate holding register, said slope rate holding register receiving its contents from said command data word holding register and inputting a signal to said slope correction rate generator to compensate for drift slope variations.

4. A time and frequency control unit as defined in claim 3 wherein the error control means further comprises:
    a transfer selection circuit the input of which comes from said command data word holding register and the output of which selectively turns on said first register, said second register, and said slope correction rate generator to receive data from said command data word holding register.

5. A time and frequency control unit as defined in claim 1 wherein said second mixer is an analog single sideband output mixer.

6. A time and frequency control unit for controlling a satellite oscillator signal of frequency $f_o$, comprising:
    an input oscillator signal of frequency $f_o$,
    a first counter having said frequency $f_o$ signal as an input for dividing said $f_o$ signal by a first modulus number, $a$, to produce an output signal of frequency $f_o/a$,
    a first mixer connected to said first counter for mixing said input signal $f_o$ with the signal output $f_o/a$ from said first counter to produce a signal frequency $$f_1 = \frac{f_o}{a} + f_o,$$

a second counter connected to said first mixer for dividing output signal $f_1$ by a second modulus number, $b$, producing a signal frequency $f_1/b$,
    a second mixer connected to the output of said second counter and to said input signal $f_o$ for mixing signal $f_o$ with $f_1/b$ to produce a signal frequency, $$f_o \pm \frac{f_1}{b},$$

a narrow single-sideband output filter connected to the output of said second mixer for passing a signal frequency, $$f_f = f_o - \frac{f_1}{b},$$

but not $$f_o + \frac{f_1}{b},$$

and
    an error control means comprising:
        first and second holding registers for storing modulus members $a$ and $b$ respectively,
        a first alternative network comprising an onboard computer interface which selectively increments and decrements said first and second holding registers, and
        a second alternative network, comprising:
            a ground-controlled, remote command source for detecting variations in frequency $f_o$, and transmitting corresponding 16-bit command data words to the satellite,
            a command data word holding register in the satellite which receives said 16-bit command data word and holds it,
            a slope correction rate generator connected to said slope rate holding register for reading the drift rate from said slope rate holding register and selectively incrementing and decrementing said first holding register and said second holding register, respectively, a transfer selection circuit, the input of which is connected to said command data word holding register, for selecting the register which is to receive the contents of said command data word holding register, an overflow detector, the input of which is connected to said first holding register output and the output of which feeds said second holding register input, for producing an output when said holding register has traversed its limits, and a series of roll-over gates, connected to said overflow detector and said first holding register, such that the output from said overflow detector selectively increments and decrements said second holding register by one count and signals the roll-over gates to reset said first holding register whenever said first holding register traverses its limits.

7. A method for controlling time and frequency of a drifting, crystal oscillator signal comprising the steps:

dividing a reference oscillator signal of frequency $f_o$ by a first modulus number $a$, mixing the reference oscillator signal with the divided-frequency signal to obtain a new frequency $$f_1 = \frac{f_o}{a} + f_o,$$

dividing signal frequency $f_1$ by a second modulus number $b$, mixing signal $f_o$ with signal $f_1/b$ to obtain a signal $$f_o \pm \frac{f_1}{b},$$

setting the operation sign of said signal $$f_o \pm \frac{f_1}{b}$$

to plus or minus to produce a final constant frequency signal, $f_f$, and selectively changing the value of $a$ and $b$ in order to correct for variations in signal $f_o$ with time.

8. A method for controlling time and frequency of a drifting crystal oscillator signal as defined in claim 7 comprising the further steps:

registering the value $a$ in a first holding register, registering the value for $b$ in a second holding register, sensing variations in signal $f_o$, changing the values of $a$ and $b$ registered in said first holding register and said second holding register, respectively, in response to the sensed variations and filtering the final output signal of frequency $f_f$, through a sensitive narrow single sideband filter.

9. A method for controlling time and frequency of a drifting crystal oscillator signal as defined in claim 8 comprisng the further step:

limiting said first register to increment and decrement within a low-point and a high-point range, turning on a roll-over gate which sets said first register back to its low-point when its high-point is traversed and vice versa, and counting said second register up or down by one count in response to the turning on of said roll-over gate, thereby preserving continuity with the coarse control operations and fine, vernier control operations.

10. A method for controlling time and frequency as defined in claim 7 wherein the mixing of the reference signal of frequency $f_o$ with the signal of frequency $f_1/b$ is analog.

* * * * *